(12) United States Patent
Kuo et al.

(10) Patent No.: US 7,787,294 B2
(45) Date of Patent: Aug. 31, 2010

(54) OPERATING METHOD OF MEMORY

(75) Inventors: Ming-Chang Kuo, Hsinchu (TW); Ming-Hsiu Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 241 days.

(21) Appl. No.: 12/031,189

(22) Filed: Feb. 14, 2008

(65) Prior Publication Data

US 2009/0207656 A1    Aug. 20, 2009

(51) Int. Cl.
G11C 16/04    (2006.01)
(52) U.S. Cl. .............................. 365/185.03; 365/185.11
(58) Field of Classification Search ............ 365/185.03, 365/185.11, 185.28
See application file for complete search history.

(56) References Cited

U.S. PATENT DOCUMENTS

| | | | |
|---|---|---|---|
| 6,011,725 A | 1/2000 | Eitan | |
| 6,686,632 B2 | 2/2004 | Ogura et al. | |
| 6,724,656 B2 | 4/2004 | Banks | |
| 6,795,342 B1 * | 9/2004 | He et al. ................. | 365/185.16 |
| 6,898,128 B2 * | 5/2005 | Prinz et al. ............. | 365/185.28 |
| 2006/0140005 A1 | 6/2006 | Yeh | |
| 2006/0171209 A1 | 8/2006 | Sim et al. | |

* cited by examiner

*Primary Examiner*—Vu A Le
(74) *Attorney, Agent, or Firm*—J.C. Patents

(57) ABSTRACT

An operating method of a memory is provided. The memory includes a memory cell array composed of a plurality of memory cells, a plurality of bit lines, and a plurality of word lines. During programming the memory, a column of memory cells is selected. A voltage difference is respectively occurred between a bit line corresponding to first source/drain regions of the memory cells in the selected column and adjacent two bit lines, and a bias is respectively applied to a word line corresponding to a control gate of each memory cell in the selected column so as to allow a data bit of the memory cell at a plurality of predetermined programmed states and an unusable bit of each memory cell in an adjacent column which shares the same bit line with the selected column at an unusable state.

19 Claims, 11 Drawing Sheets

OPERATING METHOD OF MEMORY

BACKGROUND OF THE INVENTION

1. Field of the Invention

The present invention generally relates to an operating method of an electrically erasable programmable read-only memory (EEPROM), in particular, to an operating method of a virtual-ground NOR memory.

2. Description of Related Art

Electrically erasable programmable read-only memory (EEPROM) is a non-volatile memory that is able to write, read or erase data for many times and the written data can be still stored even the power is broken. Flash memory is the most typical EEPROM. By replacing the doped polysilicon floating gate of a flash memory with silicon nitride, a charge-trapping memory is obtained as another EEPROM. In a charge-trapping memory, the charge-trapping layer is usually made of silicon nitride, a layer of silicon oxide is usually disposed respectively on and under the charge-trapping layer, and the control gate and the substrate are usually made of polysilicon or silicon. Accordingly, such a device is usually referred as a silicon/oxide/nitride/oxide/silicon (SONOS) device. Due to the charge-trapping characteristic of silicon nitride, electrons injected into a charge-trapping layer are usually localized in certain regions of the charge-trapping layer. Generally, a region close to the drain and a region close to the source in a charge-trapping layer can respectively store a bit. Thereby, each memory cell in a charge-trapping memory can store two bits.

When a SONOS memory is programmed, first, a single memory cell is selected. A word line corresponding to the control gate of the selected memory cell is applied with a bias, a bit line corresponding to the drain of the selected memory cell is also applied with a bias, the other word lines are applied with a voltage of 0V, and the other bit lines are applied with a voltage of 0V or are floated. As a result, electrons or holes are injected into a region close to the drain in the charge-trapping layer and the threshold voltage of the memory cell is changed. However, the foregoing method for programming a SONOS memory one by one is very time consuming, and reading error may be caused because the memory has a large threshold voltage distribution.

SUMMARY OF THE INVENTION

Accordingly, the present invention is directed to an operating method of a memory, wherein the time for programming the memory is reduced.

The present invention is directed to an operating method of a memory, wherein the distributions of threshold voltages at various data states are narrowed.

An operating method of a memory is provided. The memory includes a memory cell array including a plurality of memory cells. Each memory cell includes a first bit and a second bit. The operating method includes simultaneously programming the memory cells in a selected column to allow the first bits of the memory cells in the selected column to reach a plurality of predetermined programmed states.

According to an embodiment of the present invention, during programming the memory cells in the selected column, a plurality of predetermined biases are simultaneously applied to a plurality of word lines corresponding to the memory cells in the selected column.

According to an embodiment of the present invention, the predetermined programmed state is one of a plurality of programmed states corresponding to different threshold voltage distributions.

According to an embodiment of the present invention, during programming the memory cells in a selected column, each second bit of the memory cells in an adjacent column which shares the same bit line with the selected column reach an unusable state, simultaneously, wherein the unusable states are similar to each of the programmed states.

According to an embodiment of the present invention, the first bits are usable and the second bits are unusable.

According to an embodiment of the present invention, during reading data from the memory, only the programmed state of the first bit in a selected memory cells is read, and the unusable state of the second bit in the selected memory cells is ignored.

According to an embodiment of the present invention, during programming the memory, hole is injected into the memory cells in the selected column through single side bias (SSB) convergence.

According to an embodiment of the present invention, during erasing the data from the memory, electron is injected into the memory cells in the memory cells array through double side bias (DSB) electron injection or Fowler-Nordheim electron tunnelling.

According to an embodiment of the present invention, during programming the memory, electron is injected into the memory cells in the selected column through SSB convergence.

According to an embodiment of the present invention, during erasing data from the memory, hole is injected into the memory cells in the memory cells array through DSB hole injection or band-to-band tunnelling hot hole injection.

According to an embodiment of the present invention, the memory cells are MLCs.

According to an embodiment of the present invention, the memory cell array is a virtual-ground NOR memory cell array.

According to an embodiment of the present invention, the memory cells are programmed column by column.

An operating method of a memory is provided. The memory includes a memory cell array including a plurality of memory cells. The operating method includes programming the memory cells column by column, wherein the memory cells in the same column connecting to the same bit line are programmed simultaneously.

According to an embodiment of the present invention, when each programming operation is performed, a plurality of biases is simultaneously applied to a plurality of word lines corresponding to the memory cells in a selected column.

According to an embodiment of the present invention, the memory cell array is a virtual-ground NOR memory cell array.

According to an embodiment of the present invention, the memory cells are MLCs.

According to an embodiment of the present invention, during programming the memory cells in a selected column, a plurality of predetermined biases are simultaneously applied to a plurality of word lines corresponding to the memory cells in the selected column.

According to an embodiment of the present invention, during programming the memory cells in a selected column, hole is injected into the memory cells in the selected column through SSB convergence.

According to an embodiment of the present invention, during programming the memory cells in a selected column, electron is injected into the memory cells in the selected column through SSB convergence.

According to the present invention, the operating method can reduce the time for programming a memory.

According to the present invention, the operating method can narrow the distributions of threshold voltages at various data states.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
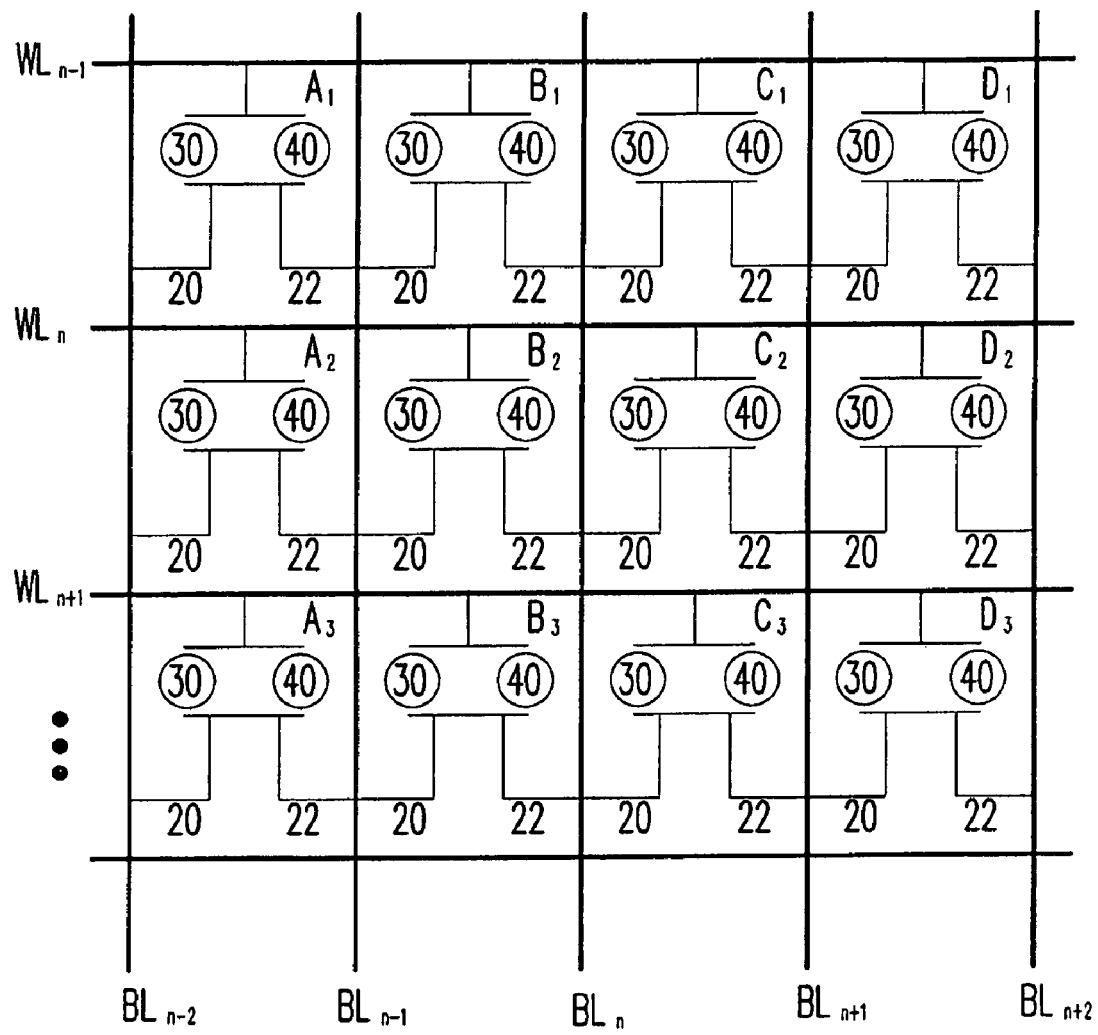
FIG. 1 is a circuit diagram of a memory applying an operating method according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
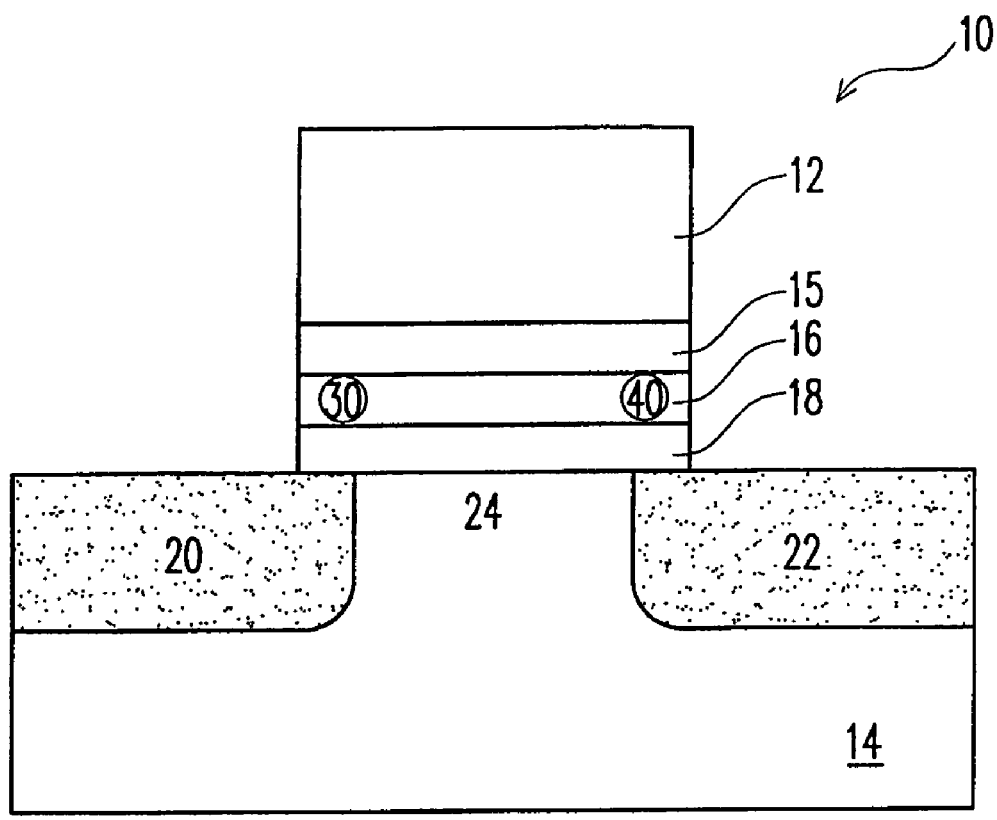
FIG. 2 is a cross-sectional view of a conventional memory cell applying an operating method according to an embodiment of the present invention.

FIG. 1 is a circuit diagram of a memory applying an operating method according to an embodiment of the present invention. FIG. 2 is a cross-sectional view of a conventional memory cell applying an operating method according to an embodiment of the present invention.

Referring to FIG. 1 and FIG. 2, the memory includes a memory cell array composed of a plurality of memory cells 10. The memory cell array is a virtual-ground NOR MLC array, for example, composed of a plurality of MLCs. The memory further includes a plurality of bit lines $BL_{n-2}$, $BL_{n-1}$, $BL_n$, $BL_{n+1}$, $BL_{n+2}$, ..., and a plurality of word lines $WL_{n-1}$, $WL_{n+1}$, $WL_{n+2}$, .... Each of the memory cells 10 includes a control gate 12, a charge-trapping layer 16, a source/drain region 20, and a source/drain region 22. Here a source/drain region refers to a region which can be served as either a source region or a drain region according to the current direction thereof. The source/drain region 20 and the source/drain region 22 are disposed in a substrate 14. The control gate 12 is dispose above a channel region 24 between the source/drain region 20 and the source/drain region 22. The charge-trapping layer 16 is disposed between the control gate 12 and the substrate 14. The charge-trapping layer 16 is a dielectric layer, for example, a silicon nitride layer. A tunnelling dielectric layer 18 is disposed between the charge-trapping layer 16 and the substrate 14. The material of the tunnelling dielectric layer 18 may be silicon oxide. A dielectric layer 15 may be disposed between the control gate 12 and the charge-trapping layer 16. The material of the dielectric layer 15 may be silicon oxide. Since the charge-trapping layer 16 is a dielectric layer and which can confine the injected electrons or holes in certain regions, data state can be respectively stored in a region 30 close to the source/drain region 20 or a region 40 close to the source/drain region 22 when the memory cell 10 is programmed. However, in the present embodiment, the region 30 in the charge-trapping layer 16 close to the source/drain region 20 is actually a data bit used for storing data, when the region 40 close to the source/drain region 22 is an unusable bit.

In the memory cell array, the memory cells $A_1$, $A_2$, and $A_3$, the memory cells $B_1$, $B_2$, and $B_3$, the memory cells $C_1$, $C_2$, and $C_3$, and the memory cells $D_1$, $D_2$, and $D_3$ are respectively arranged as a column. The memory cells $A_1$, $B_1$, $C_1$, and $D_1$, the memory cells $A_2$, $B_2$, $C_2$, and $D_2$, and the memory cells $A_3$, $B_3$, $C_3$, and $D_3$ are respectively arranged as a row. The source/drain region 20 of each of the memory cells is connected to the source/drain region 22 of an adjacent memory cell in the same row, and the source/drain regions 20 of the memory cells in the same column are connected to a bit line BL. For example, the source/drain region 20 of memory cell $C_1$ is connected to the source/drain region 22 of memory cell $B_1$, and the source/drain regions 20 of memory cell $C_1$ is connected to the source/drain regions 20 of memory cells $C_2$ and $C_3$ through the bit line $BL_n$. Additionally, in the memory cell array, the control gates 12 of memory cells in the same row are corresponding to the same word line WL. For example, the control gates 12 of memory cells $A_1$, $B_1$, $C_1$, and $D_1$ are corresponding to the same word line $WL_{n-1}$.

Figure 3:
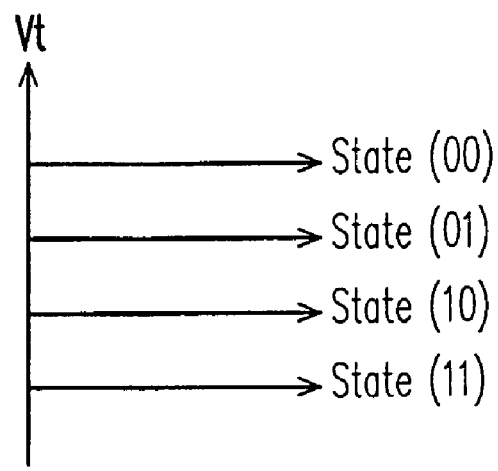
FIG. 3 illustrates the relationship between the threshold voltage and various data state of a memory cell according to an embodiment of the present invention.

During erasing the data from the memory, biases are applied to all the memory cells 10 in the memory cell array so that the data bits 30 and unusable bits 40 of the memory cells 10 are at the initial state. During programming the memory, the data bits 30 of the memory cells 10 in the same column at the same time are programmed. During reading data from the memory cells, only the programmed state in the data bit 30 of the selected memory cell is read, and the unusable state in the unusable bit 40 of the selected memory cell 10 is ignored. According to the present invention, a memory cell 10 can have a plurality of states according to the threshold voltage thereof. Referring to FIG. 3, in an embodiment of the present invention, a memory cell 10 has four states according to the distribution of its threshold voltage, wherein the four states are respectively state (00), state (01), state (10), and state (11) in a decreasing order. In an embodiment of the present invention, the state (00) corresponding to the highest threshold voltage is defined as a initial state, and the memory cell 10 is programmed from the initial state to state (01), state (10), or state (11) corresponding to lower threshold voltages. In another embodiment of the present invention, the state (11) corresponding to the lowest threshold voltage is defined as the initial state, and the memory cell 10 is programmed from the initial state to state (10), state (01), or state (00) corresponding to higher threshold voltages.

First Embodiment

Figure 4A:
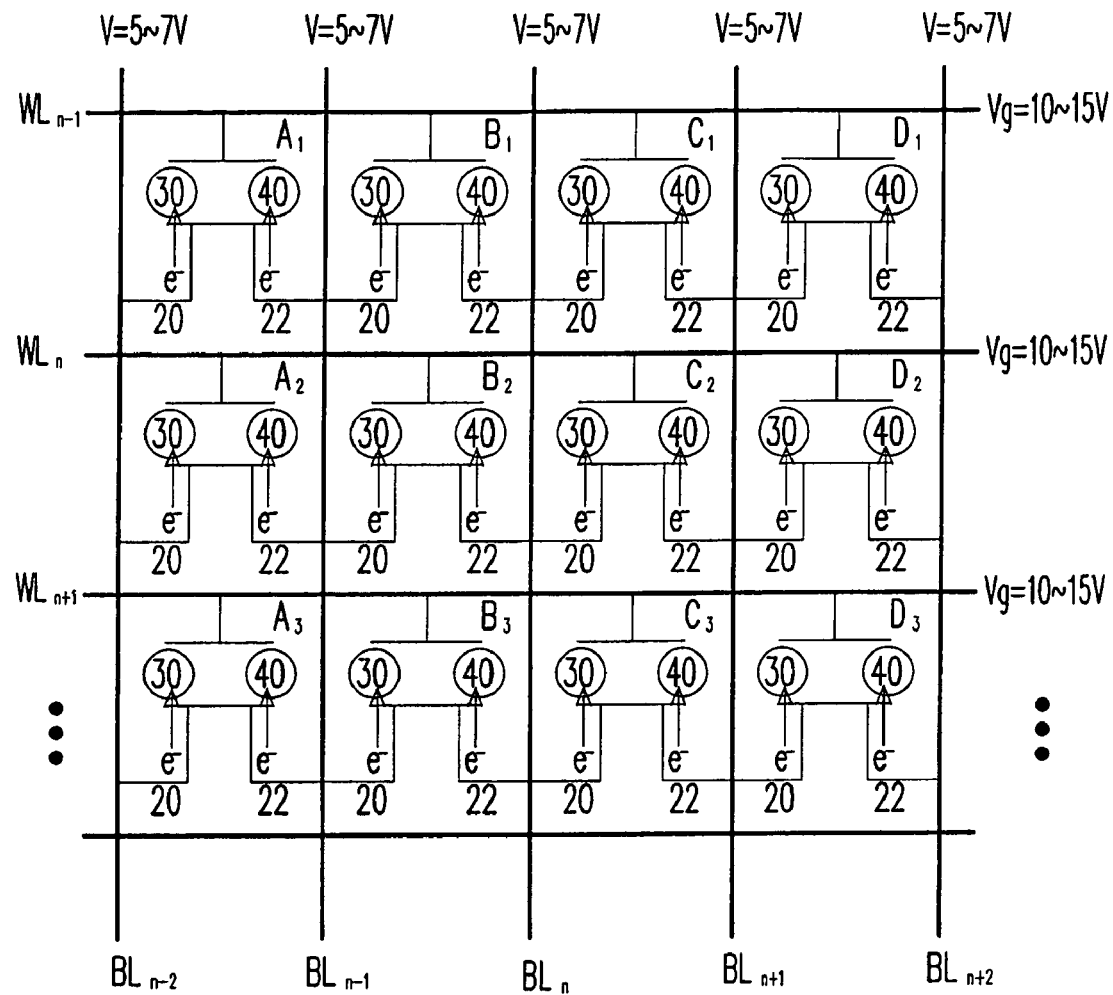
FIG. 4A is a circuit diagram of a memory when data is erased from the memory through electron injection according to an embodiment of the present invention.
Figure 4B:
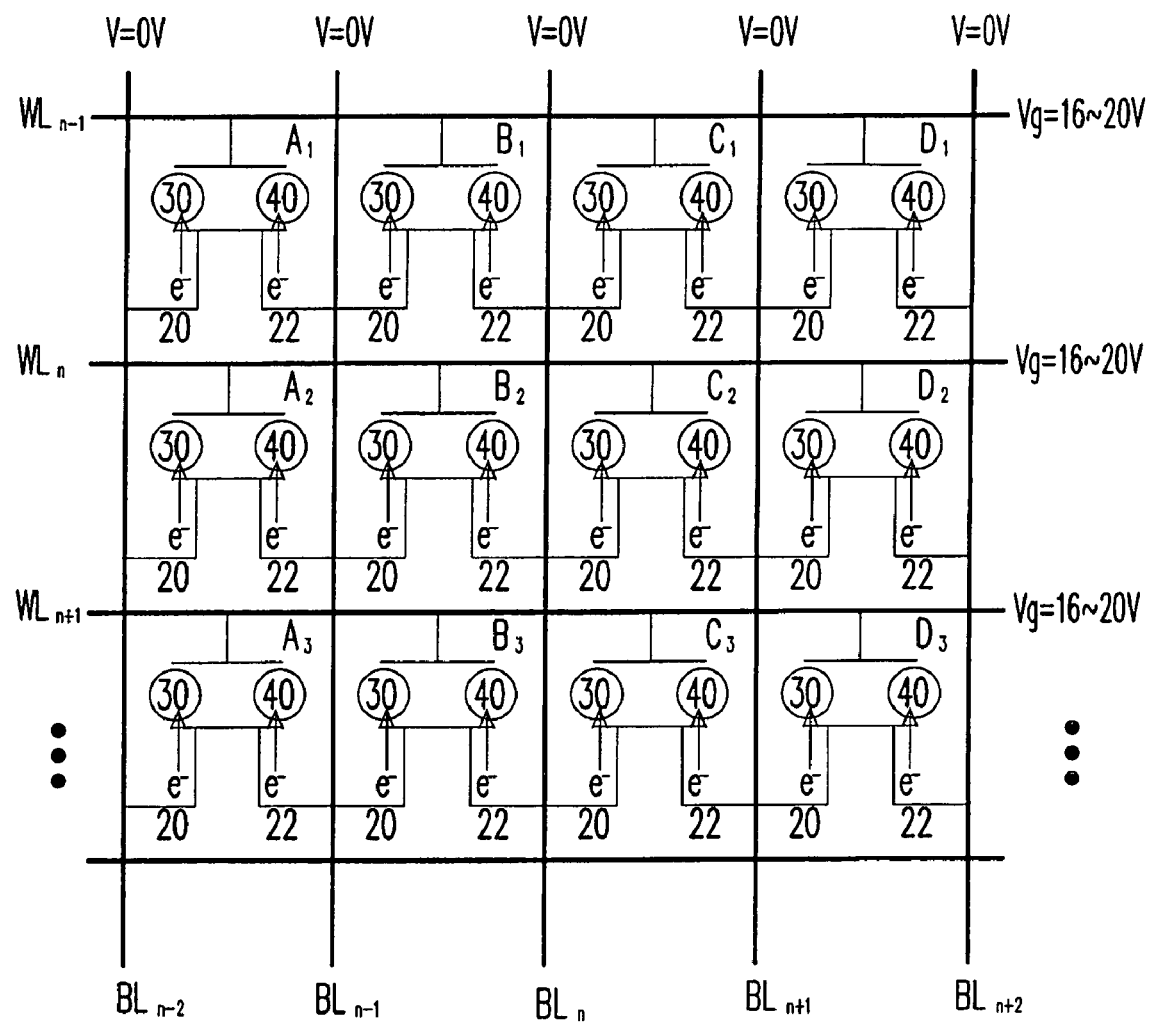
FIG. 4B is a circuit diagram of a memory when data is erased from the memory through electron injection according to another embodiment of the present invention.

Referring to FIGS. 4A and 4B, during erasing the data from the memory, biases are applied to all the memory cells 10 in the memory cell array so that the data bits 30 and unusable bits 40 of the memory cells 10 are at the initial state having the highest threshold voltage, namely, state (00). Referring to FIG. 4A, in an embodiment of the present invention, during erasing the data from the memory, the threshold voltages of all the memory cells 10 are reduced through double side bias (DSB) electron injection. According to the operating method, a voltage of 0V is applied to the substrate 14, voltages between 10V and 15V are applied to all the word lines $WL_{n-1}$, $WL_n$, and $WL_{n+1}$, and voltages between 5V and 7V are applied to all the bit lines $BL_{n-2}$, $BL_{n-1}$, $BL_n$, $BL_{n+1}$, and $BL_{n+2}$, so that electrons are injected and trapped in the charge-trapping layers 16 and accordingly both the data bits 30 and the unusable bits 40 are at state (00). Referring to FIG. 4B, in another embodiment of the present invention, during erasing the data from the memory, the threshold voltages of all the memory cells 10 are increased through Fowler-Nordheim electron tunnelling. According to this operating method, a voltage of 0V is applied to the substrate 14, voltages between 16V and 20V are applied to all the word lines $WL_{n-1}$, $WL_n$, and $WL_{n+1}$, and a voltage of 0V is applied to all the bit lines $BL_{n-2}$, $BL_{n-1}$, $BL_n$, $BL_{n+1}$, and $BL_{n+2}$, so that electrons are injected and trapped in the charge-trapping layers 16 and accordingly both the data bits 30 and the unusable bits 40 are at state (00).

During programming the memory, a voltage difference is respectively occurred between the bit line corresponding to the source/drain region 20 of a selected memory cell 10 and adjacent two bit lines respectively, and meanwhen, appropriate voltages (for example, between −2V and 2V) are applied to all the word lines, so that the data bits 30 of the memory cells 10 in the same column at the same time are programmed into state (01), state (10), or state (11), respectively, having lower threshold voltages through single side bias (SSB) convergence. Below, an operation of programming the memory cells $D_1$, $D_2$, and $D_3$ in the same column at the same time will be described as an example.

Figure 5:
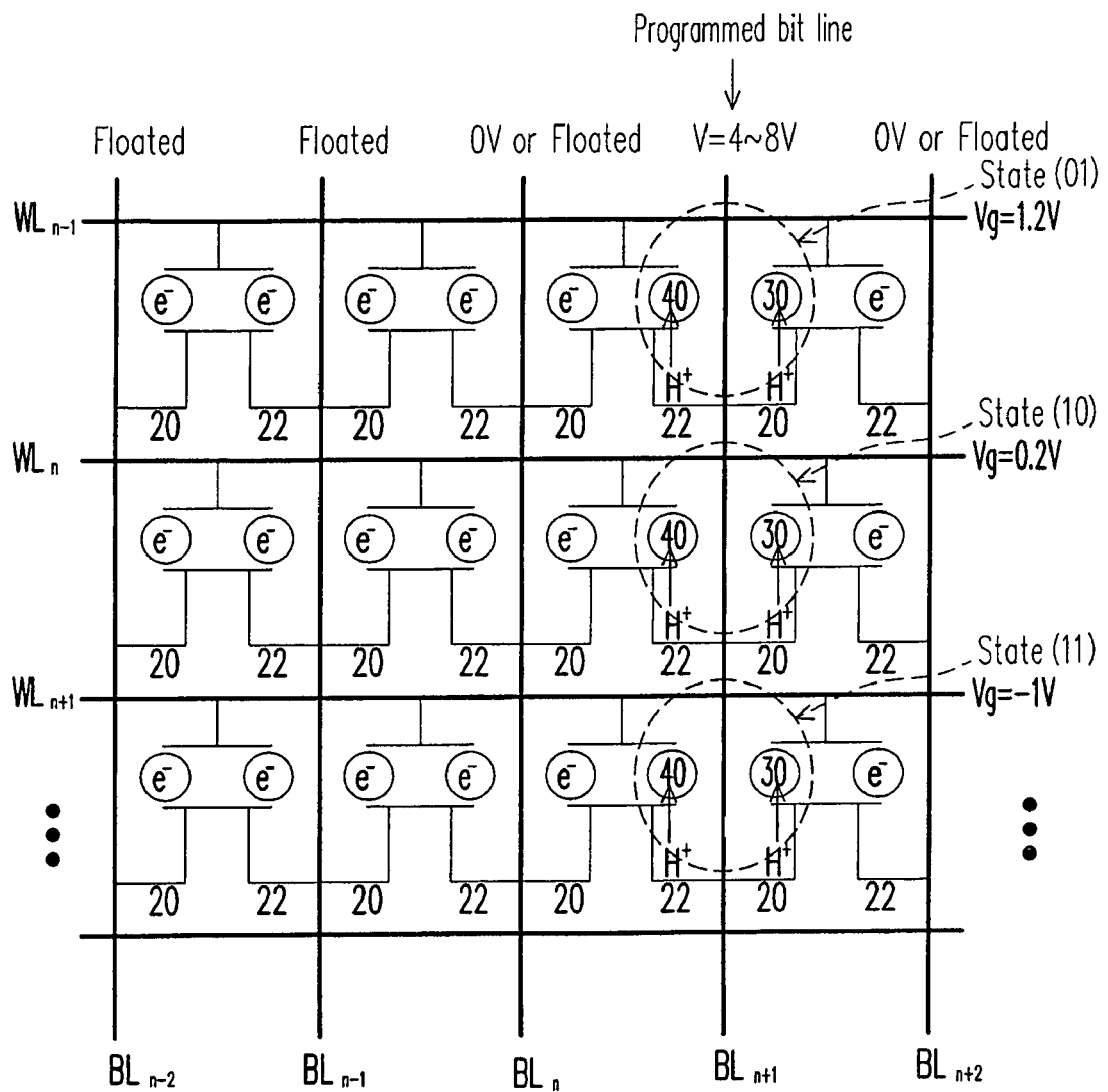
FIG. 5 is a circuit diagram of a memory when the memory is programmed through hole injection according to an embodiment of the present invention.
Figure 6:
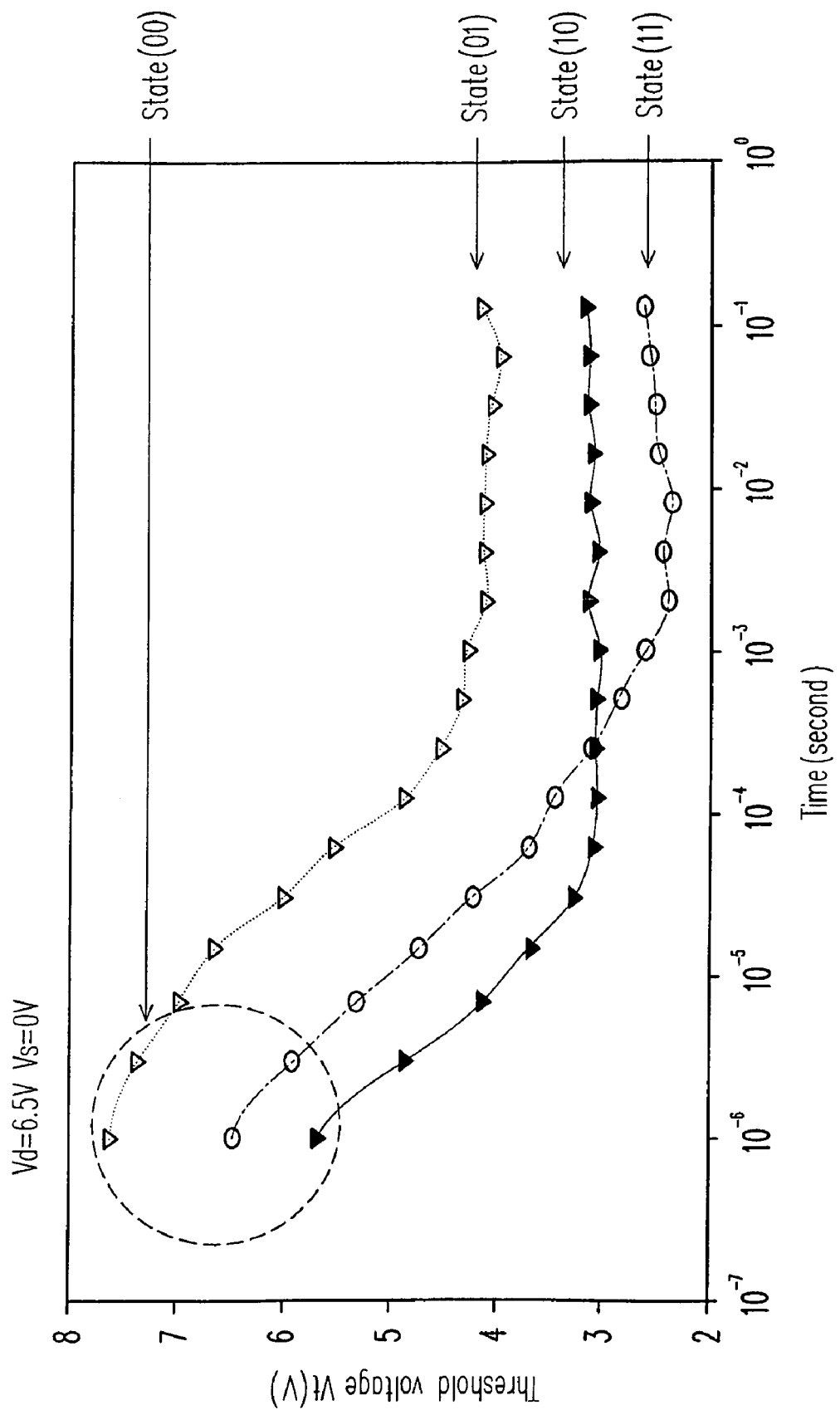
FIG. 6 is a graph illustrating threshold voltages vs. time in a memory programmed through hole injection according to an embodiment of the present invention.

Referring to FIG. 5, it is assumed that the predetermined programmed states of the memory cells $D_1$, $D_2$, and $D_3$ are respectively state (01), state (10), and state (11). During programming the memory cells $D_1$, $D_2$, and $D_3$ in the same column, a voltage of 0V is applied to the substrate 14, a voltage between 4V and 8V is applied to the bit line $BL_{n+1}$, and a same voltage (for example, 0V) is applied to the adjacent two bit lines $BL_{n+2}$ and $BL_n$ or the two are floated, so that a voltage difference is respectively produced between the bit lines $BL_{n+1}$ and $BL_{n+2}$ and between the bit lines $BL_{n+1}$ and $BL_n$. The other bit lines $BL_{n-1}$ and $BL_{n-2}$ are floated. Moreover, voltages (for example, 1.2V, 0.2V, and −1.0V) are respectively applied to the word lines $WL_{n-1}$, $WL_n$, and $WL_{n+1}$ at the same time. Hot holes are generated from the junction of the source/drain regions 20 of the memory cells $D_1$, $D_2$, and $D_3$ and accelerated into the substrate 14, and many electron-hole pairs are generated due to the function of ionization. The holes in the electron-hole pairs are attracted by the large number of electrons in the data bits 30 in the charge-trapping layers 16 of the memory cells $D_1$, $D_2$, and $D_3$ being at the initial state and accordingly are injected into the charge-trapping layers 16 of the memory cells $D_1$, $D_2$, and $D_3$, so that the threshold voltages of the data bits 30 are converged from higher threshold voltages to lower threshold voltages. As a result, the data bits 30 of the memory cells $D_1$, $D_2$, and $D_3$ respectively are at state (01), state (10), and state (11), as shown in FIG. 6.

During programming the memory cells $D_1$, $D_2$, and $D_3$, the source/drain regions 20 of the memory cells $D_1$, $D_2$, and $D_3$ are respectively connected to the source/drain regions 22 of the adjacent memory cells $C_1$, $C_2$, and $C_3$ and are all connected to the bit line $BL_{n+1}$, and the adjacent bit line BLn is also applied with a voltage of 0V or is floated, namely, the voltage difference between the bit line $BL_{n+1}$ and the bit line $BL_n$ is the same as the voltage difference between the bit line $BL_{n+1}$ and the bit line $BL_{n+2}$. Thus, hot holes are generated from the junction of the source/drain regions 22 of the memory cells $C_1$, $C_2$, and $C_3$ and accelerated into the substrate 14, and accordingly many electron-hole pairs are also produced due to the function of the ionization. Similarly, the holes in the electron-hole pairs are also attracted by the large number of electrons in the unusable bits 40 of the charge-trapping layers 16 of the memory cells $C_1$, $C_2$, and $C_3$ having the initial state and accordingly injected into the charge-trapping layers 16 of the memory cells $C_1$, $C_2$, and $C_3$, so that the threshold voltages of the unusable bits 40 are converged from higher threshold voltages to lower threshold voltages, and accordingly the unusable bits 40 of the memory cells $C_1$, $C_2$, and $C_3$ respectively are at state (01), state (10), and state (11).

The memory cells 10 can be programmed column by column through the same method described above so as to allow the data bits 30 and the unusable bits 40 of the memory cells 10 in the same column to being at state (01), state (10), or state (11) at the same time.

In the present invention, even the data bits 30 and unusable bits 40 of the memory cells 10 are all at state (01), state (10), or state (11) after the memory cells 10 are programmed, only the states stored in the data bits 30 are usable and served as data states, when the states stored in the unusable bits 40 are unusable states. Thus, during reading data from the memory cells 10, only the programmed state in the data bit 30 of the selected memory cell is read, and the unusable state in the unusable bit 40 of the selected memory cell 10 is ignored.

Figure 7:
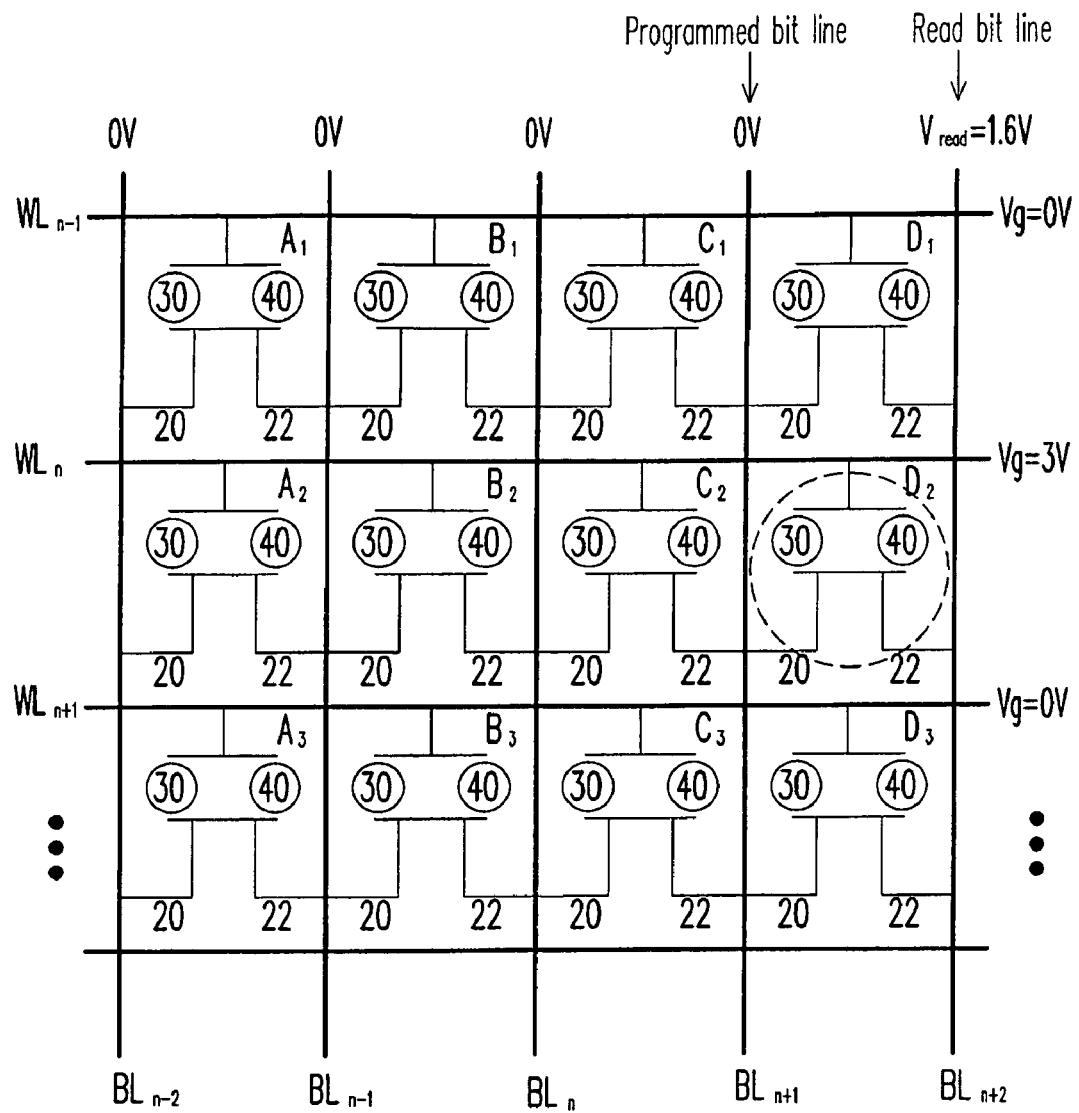
FIG. 7 is a circuit diagram of a memory when data is read from the memory according to an embodiment of the present invention.

Referring to FIG. 7, during reading the data state in the data bit 30 of the selected memory cell $D_2$, a voltage of 3V is applied to the word line. $WL_n$ corresponding to the control gate 12 of the memory cell $D_2$ and a voltage of 0V is applied to other word lines $WL_{n-1}$ and $WL_{n+1}$. Besides, a voltage of 1.6V is applied to the bit line $BL_{n+2}$ corresponding to the source/drain region 22 of the memory cell $D_2$, and a voltage of 0V is applied to other bit lines $BL_{n+1}$, $BL_n$, $BL_{n-1}$, and $BL_{n-2}$. The data state in the data bit 30 of the memory cell $D_2$ is determined according to the value of a read current.

Second Embodiment

Figure 8A:
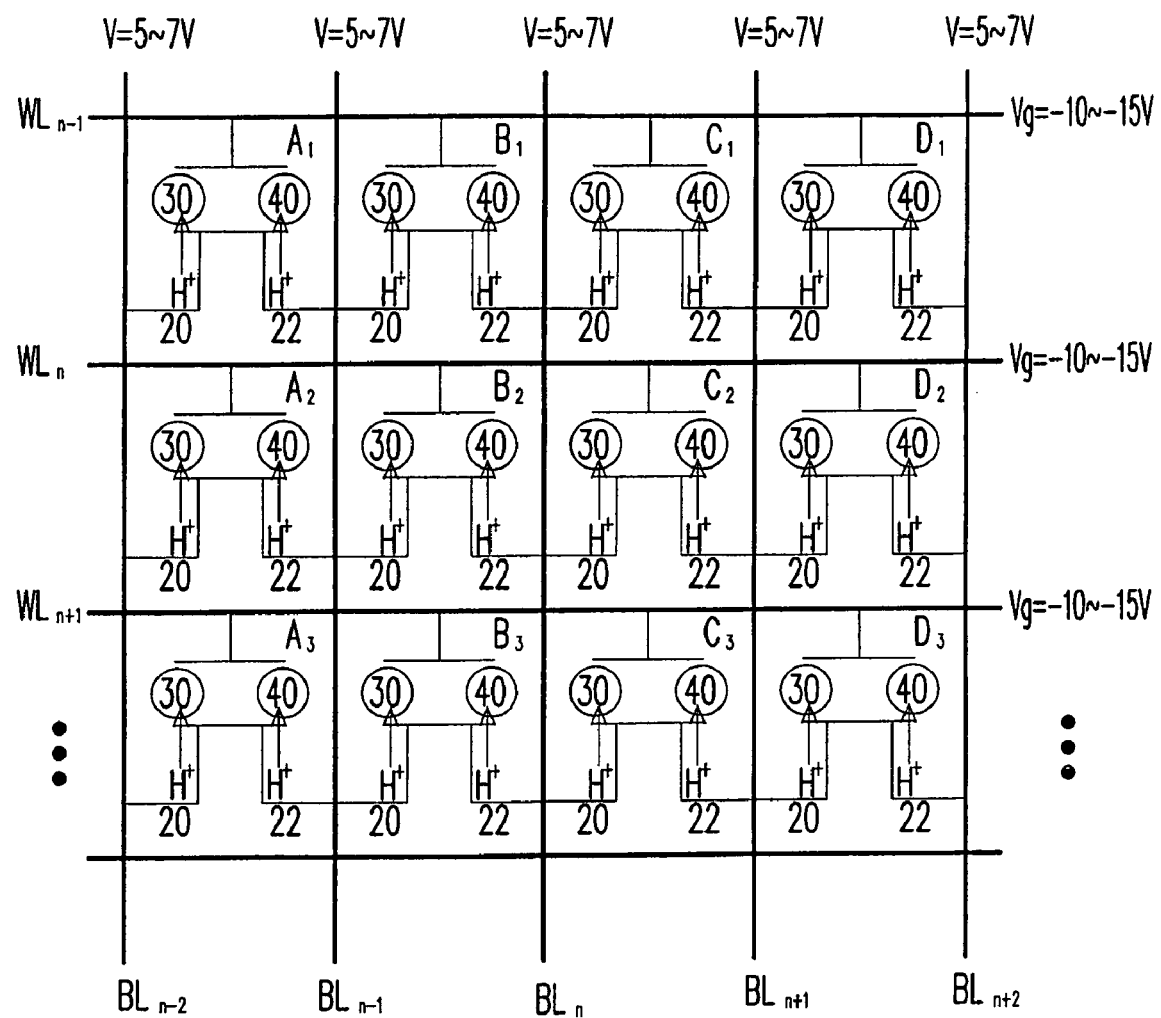
FIG. 8A is a circuit diagram of a memory when data is erased from the memory through hole injection according to an embodiment of the present invention.
Figure 8B:
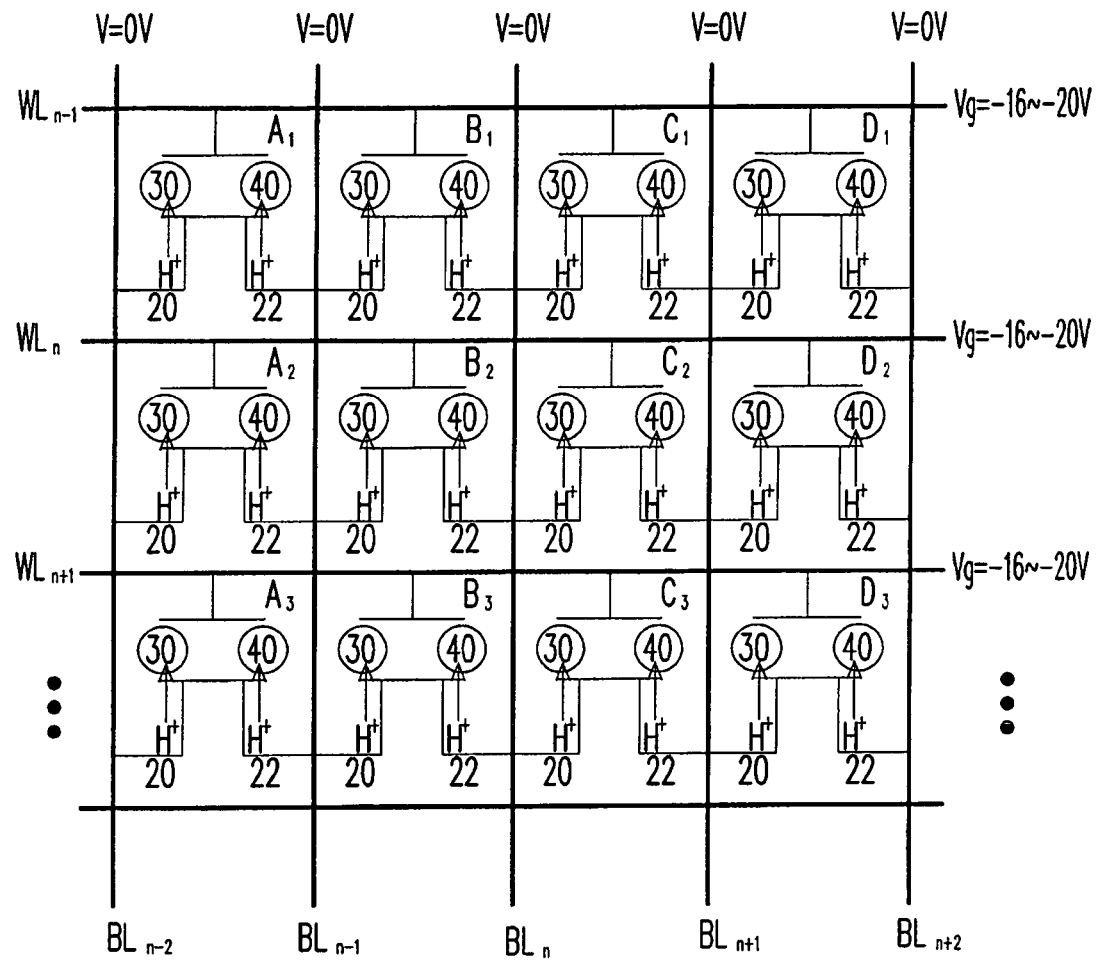
FIG. 8B is a circuit diagram of a memory when data is erased from the memory through hole injection according to another embodiment of the present invention.

Referring to FIGS. 8A and 8B, during erasing the data from the memory, biases are applied to all the memory cells 10 in the memory cell array so that the data bits 30 and the unusable bits 40 of the memory cells 10 are at the initial state having the lowest threshold voltage, namely, state (11). Referring to FIG. 8A, in an embodiment of the present invention, during erasing the data from the memory, the threshold voltages of all the memory cells 10 are reduced through DSB hole injection. According to this operating method, a voltage of 0V is applied to the substrate 14, voltages between −10V and −15V are applied to all the word lines $WL_{n-1}$, $WL_n$, and $WL_{n+1}$, and voltages between 5V and 7V are applied to all the bit lines $BL_{n-2}$, $BL_{n-1}$, $BL_n$, $BL_{n+1}$, and $BL_{n+2}$, so that holes are injected and trapped in the charge-trapping layers 16 and accordingly both the data bits 30 and the unusable bits 40 are at state (11). Referring to FIG. 8B, in another embodiment of the present invention, during erasing the data from the memory, the threshold voltages of all the memory cells 10 are reduced through band-to-band tunnelling hot hole injection. According to this operating method, a voltage of 0V is applied to the substrate 14, voltages between −16V and −20V are applied to all the word lines $WL_{n-1}$, $WL_n$, and $WL_{n+1}$, and a voltage of 0V is applied to all the bit lines $BL_{n-2}$, $BL_{n-1}$, $BL_n$, $BL_{n+1}$, and $BL_{n+2}$, so that holes are injected and trapped in the charge-trapping layers 16 and accordingly both the data bits 30 and the unusable bits 40 are at state (11).

During programming the memory, a voltage difference is respectively occurred between the bit line corresponding to the source/drain region 20 of a selected memory cell 10 and adjacent two bit lines respectively. Meanwhen, appropriate voltages, for example −2V to 2V, are applied to all the word lines, so that the data bits 30 of the memory cells 10 in the same column are simultaneously programmed into state (00), state (01), or state (00), respectively, having higher threshold voltages through SSB convergence. Below, an operation of programming memory cells $D_1$, $D_2$, and $D_3$ in the same column at the same time will be described as an example.

Figure 9:
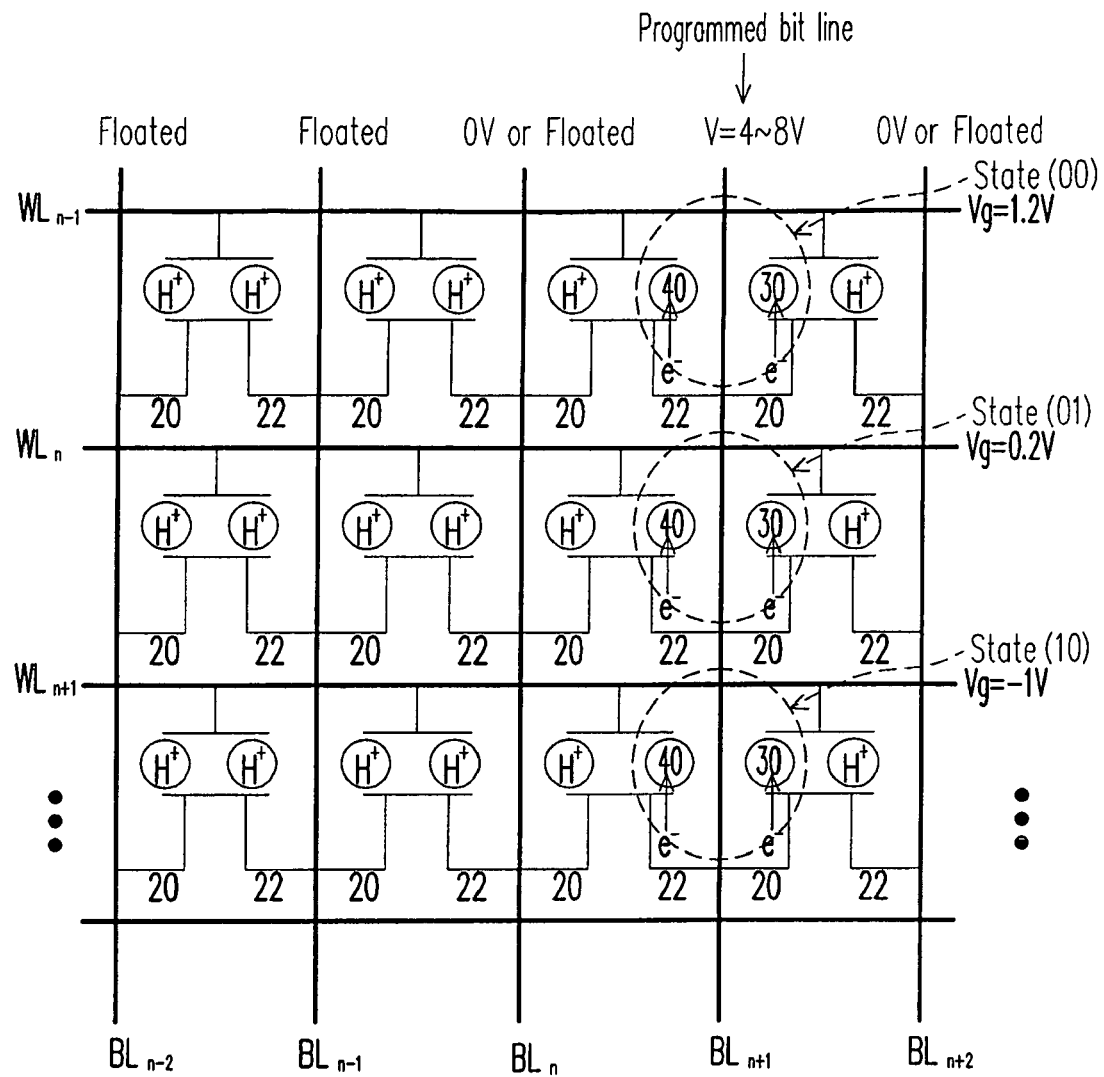
FIG. 9 is a circuit diagram of a memory when the memory is programmed through electron injection according to an embodiment of the present invention.
Figure 10:
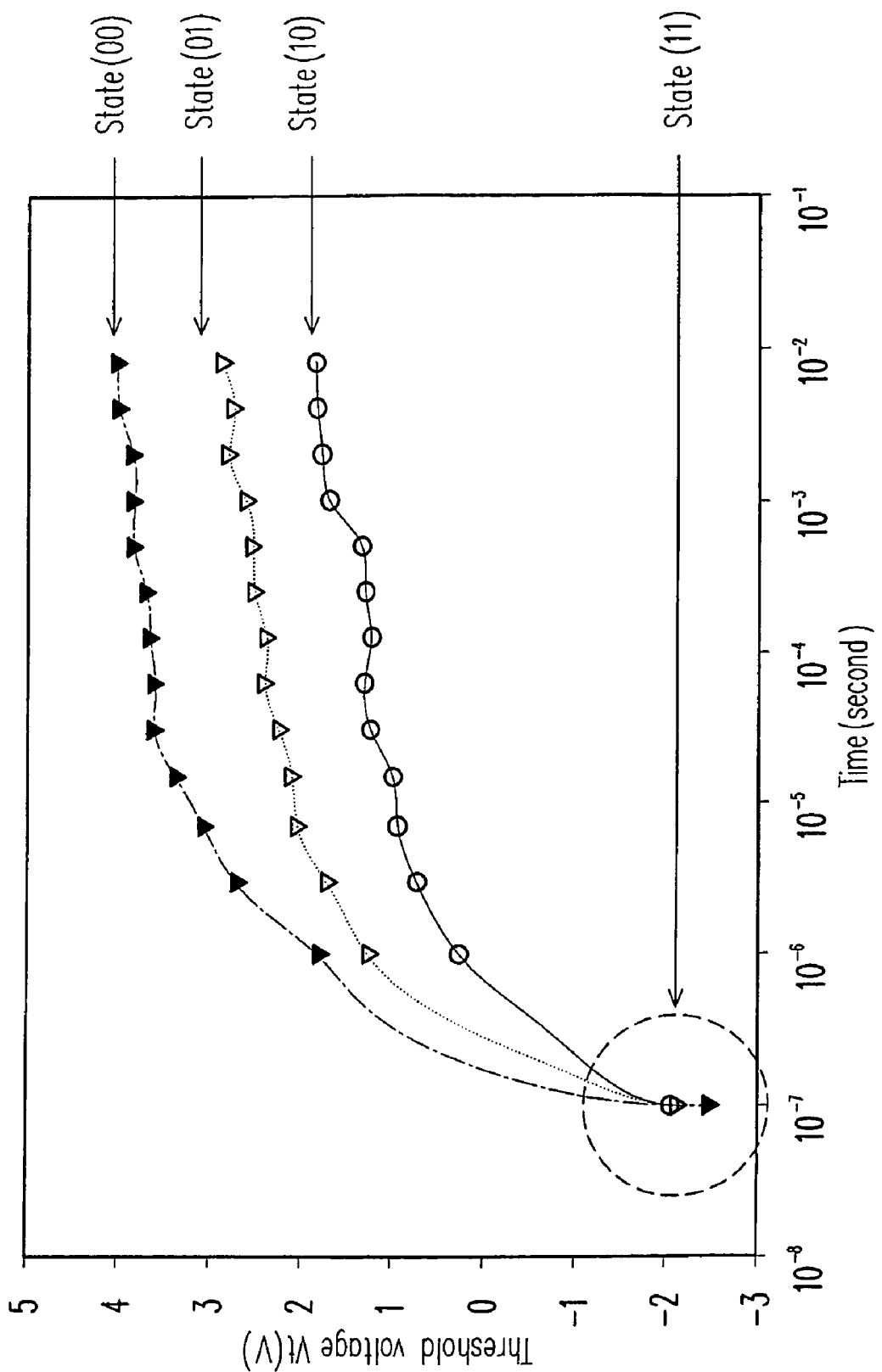
FIG. 10 is a graph illustrating threshold voltages vs. time in a memory programmed through electron injection according to an embodiment of the present invention.

Referring to FIG. 9, it is assumed that the predetermined programmed states of the memory cells $D_1$, $D_2$, and $D_3$ are respectively state (00), state (01), and state (11). During programming the memory cells $D_1$, $D_2$, and $D_3$ in the same column, a voltage of 0V is applied to the substrate 14, a voltage between 4V and 8V is applied to the bit line $BL_{n+1}$, and a same voltage, for example 0V, is applied to the adjacent bit lines $BL_{n+2}$ and $BL_n$ or the two are floated, so that a voltage difference is respectively produced between the bit line $BL_{n+1}$ and the bit line $BL_{n+2}$ and between the bit line $BL_{n+1}$ and the bit line $BL_n$. The other bit lines $BL_{n-1}$ and $BL_{n-2}$ are floated. Moreover, voltages of 1.2V, 0.2V, and −1.0V are respectively applied to the word lines $WL_{n-1}$, $WL_n$, and $WL_{n+1}$ at the same time. Hot holes are generated from the junction of the source/drain regions 20 of the memory cells $D_1$, $D_2$, and $D_3$ and accelerated into the substrate 14, and many electron-hole pairs are generated due to the function of ionization. The electrons in the electron-hole pairs are attracted by the large number of holes in data bits 30 of the charge-trapping layers 16 of the memory cells $D_1$, $D_2$, and $D_3$ being at the initial state and accordingly are injected into the charge-trapping layers 16 of the memory cells $D_1$, $D_2$, and $D_3$, so that the threshold voltages of the data bits 30 are converged from lower threshold voltages to higher threshold voltages. As a result, the data bits 30 of the memory cells $D_1$, $D_2$, and $D_3$ respectively are at state (00), state (01), and state (10), as shown in FIG. 10.

During programming the memory cells $D_1$, $D_2$, and $D_3$, the source/drain regions 20 of the memory cells $D_1$, $D_2$, and $D_3$ are respectively connected to the source/drain regions 22 of the adjacent memory cells $C_1$, $C_2$, and $C_3$ and are all connected to the bit line $BL_{n+1}$, and the adjacent bit line $BL_n$ is also applied with a voltage of 0V or floated, namely, the voltage difference between the bit line $BL_{n+1}$ and the bit line $BL_n$ is the same as the voltage between the bit line $BL_{n+1}$ and the bit line $BL_{n+2}$. Thus, hot holes are generated from the junction of the source/drain regions 22 of the memory cells $C_1$, $C_2$, and $C_3$ and accelerated into the substrate 14, and many electron-hole pairs are also produced due to the function of ionization. Similarly, the electrons in the electron-hole pairs are also attracted by the large number of holes in the unusable bits 40 in the charge-trapping layers 16 of the memory cells $C_1$, $C_2$, and $C_3$ and accordingly are injected into the charge-trapping layers of the memory cells $C_1$, $C_2$, and $C_3$ having the initial state, so that the threshold voltages of the unusable bits 40 are converged from lower threshold voltages to higher threshold voltages. As a result, the unusable bits 40 of the memory cells $C_1$, $C_2$, and $C_3$ respectively are at state (00), state (01), and state (10).

The memory cells 10 can be programmed column by column through the same method described above so as to allow the data bits 30 and the unusable bits 40 of the memory cells 10 in the same column to being at state (01), state (10), or state (11) at the same time.

In the present invention, even the data bits 30 and unusable bits 40 of the memory cells 10 can all are at state (01), state (10), or state (11) after the memory cells 10 are programmed, only the states stored in the data bits 30 are usable and served as data states, when the states stored in the unusable bits 40 are unusable states. Thus, during reading data from the memory cells 10, only the programmed state in the data bit 30 of the selected memory cell 10 is read, and the unusable state in the unusable bit 40 of the selected memory cell 10 is ignored.

Referring to FIG. 7, during reading the data state in the data bit 30 of the selected memory cell $D_2$, a voltage of 3V is applied to the word line $WL_n$ corresponding to the control gate 12 of the memory cell $D_2$ and a voltage of 0V is applied to other word lines $WL_{n-1}$ and $WL_{n+1}$. Besides, a voltage of 1.6V is applied to the bit line $BL_{n+2}$ corresponding to the source/drain region 22 of the memory cell $D_2$, and a voltage of 0V is applied to other bit lines $BL_{n+1}$, $BL_n$, $BL_{n-1}$, and $BL_{n-2}$. The data state in the data bit 30 of the memory cell $D_2$ is determined according to the value of a read current.

In the operating method provided by the present invention, the threshold voltages of the memory cells can precisely reach predetermined states through SSB convergence, and the distributions of the threshold voltages are narrowed.

According to the present invention, during programming a memory, a voltage is applied to a selected bit line and a plurality of bias is applied to all the word lines so that the memory cells in the same column can be programmed at the same time. Accordingly, the time required for programming a memory cells array is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operating method of a memory, wherein the memory comprises a memory cell array including a plurality of memory cells, each memory cell includes a first bit and a second bit, the operating method comprises:
   simultaneously programming the memory cells in a selected column to allow the first bits of the memory cells in the selected column to reach a plurality of predetermined programmed states corresponding to a plurality of threshold voltage distributions.

2. The operating method according to claim 1, wherein during programming the memory cells in the selected column, a plurality of predetermined biases are simultaneously applied to a plurality of word lines corresponding to the memory cells in the selected column.

3. The operating method according to claim 1, wherein during programming the memory cells in a selected column, each second bit of the memory cells in an adjacent column which shares the same bit line with the selected column reach an unusable state, simultaneously, wherein the unusable states are similar to each of the programmed states.

4. The operating method according to claim 3, wherein the first bits are usable and the second bits are unusable.

5. The operating method according to claim 3, wherein during reading data from the memory, only the programmed state of the first bit in a selected memory cells is read, and the unusable state of the second bit in the selected memory cells is ignored.

6. The operating method according to claim 1, wherein during programming the memory, hole is injected into the memory cells in the selected column through single side bias (SSB) convergence.

7. The operating method according to claim 6, wherein during erasing the data from the memory, electron is injected into the memory cells in the memory cells array through double side bias (DSB) electron injection or Fowler-Nordheim electron tunnelling.

8. The operating method according to claim 1, wherein during programming the memory, electron is injected into the memory cells in the selected column through SSB convergence.

9. The operating method according to claim 8, wherein during erasing data from the memory, hole is injected into the memory cells in the memory cells array through DSB hole injection or band-to-band tunnelling hot hole injection.

10. The operating method according to claim 1, wherein the memory cells are MLCs.

11. The operating method according to claim 1, wherein the memory cell array is a virtual-ground NOR memory cell array.

12. The operating method according to claim 1, wherein the memory cells are programmed column by column.

13. An operating method of a memory, wherein the memory comprises a memory cell array including a plurality of memory cells, the operating method comprises:
  programming the memory cells column by column, wherein the memory cells in the same column connecting to the same bit line are programmed simultaneously to reach a plurality of predetermined programmed states corresponding to a plurality of threshold voltage distributions.

14. The operating method according to claim 13, wherein during each programming operation is performed, a plurality of biases is simultaneously applied to a plurality of word lines corresponding to the memory cells in a selected column.

15. The operating method according to claim 13, wherein the memory cell array is a virtual-ground NOR memory cell array.

16. The operating method according to claim 13, wherein the memory cells are MLCs.

17. The operating method according to claim 13, wherein during programming the memory cells in a selected column, a plurality of predetermined biases are simultaneously applied to a plurality of word lines corresponding to the memory cells in the selected column.

18. The operating method according to claim 13, wherein during programming the memory cells in a selected column, hole is injected into the memory cells in the selected column through SSB convergence.

19. The operating method according to claim 13, wherein during programming the memory cells in a selected column, electron is injected into the memory cells in the selected column through SSB convergence.

* * * * *